(12) United States Patent
Kwak et al.

(10) Patent No.: US 8,330,366 B2
(45) Date of Patent: Dec. 11, 2012

(54) PLASMA DISPLAY DEVICE

(75) Inventors: Jungsun Kwak, Yongin-si (KR); Juntae Kim, Yongin-si (KR); Jungheon Kim, Yongin-si (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 262 days.

(21) Appl. No.: 12/654,036

(22) Filed: Dec. 8, 2009

(65) Prior Publication Data

US 2010/0141140 A1 Jun. 10, 2010

(30) Foreign Application Priority Data

Dec. 8, 2008 (KR) ........................ 10-2008-0123969

(51) Int. Cl.
*H01J 17/49* (2006.01)
(52) U.S. Cl. ...................................... 313/582
(58) Field of Classification Search .......... 313/582–587; 345/37, 41, 60, 71
See application file for complete search history.

(56) References Cited

U.S. PATENT DOCUMENTS

| 2002/0153840 A1* | 10/2002 | Isohata et al. ............... 313/582 |
| 2005/0116644 A1* | 6/2005 | Kim et al. .................... 313/582 |
| 2006/0066238 A1 | 3/2006 | Woo |
| 2006/0132946 A1* | 6/2006 | Kim et al. ..................... 359/885 |
| 2007/0159777 A1 | 7/2007 | Shin |

FOREIGN PATENT DOCUMENTS

| JP | 11-352897 | * 12/1999 |
| KR | 100728205 B1 | 5/2006 |
| KR | 1020060062272 A | 6/2006 |
| KR | 1020060069572 A | 6/2006 |
| KR | 1020070091447 A | 9/2007 |

* cited by examiner

*Primary Examiner* — Mariceli Santiago
*Assistant Examiner* — Donald Raleigh
(74) *Attorney, Agent, or Firm* — Robert E. Bushnell, Esq.

(57) ABSTRACT

A plasma display device that can reduce vibration noise of the conductive tape through reducing the vibration of the conductive tape caused by vibration of the outside or inside of the plasma display panel by forming the noise prevention hole in the conductive tape attached to the filter and bracket. The plasma display device includes: a plasma display panel; a filter attached on a front surface of the plasma display panel; a chassis base whose front surface is mounted on the rear surface of the plasma display panel; a driving circuit unit, mounted on the rear surface of the chassis base, driving the plasma display panel; a plurality of brackets, connected to the rear surface of the chassis base, being extended to the front surface of the plasma display panel; and a conductive tape, attached to the filter and bracket, transmitting electromagnetic wave incident on the filter to the chassis base, where the conductive tape includes a plurality of noise prevention holes.

15 Claims, 6 Drawing Sheets

PLASMA DISPLAY DEVICE

CLAIM FOR PRIORITY

This, application makes reference to, incorporates the same herein, and claims all benefits accruing under 35 U.S.C. §119 from an application for PLASMA DISPLAY DEVICE earlier filed in the Korean Intellectual Property Office on 8 Dec. 2008 and there duly assigned Serial No. 10-2008-0123969.

BACKGROUND OF THE INVENTION

1. Field of the Invention

An aspect of the present invention relates to a plasma display device, and more particularly, to a plasma display device exhibiting a reduction in noise created by vibration applied to either the exterior or to the interior of the plasma display panel.

2. Description of the Related Art

Recently, photoelectronics components and devices have been actively developed in concert with progress in information technology. By way of example image display devices have been widely supplied for a television set and a monitor of personal computers. In addition, display device have become larger and thinner.

A plasma display device includes a plasma display panel having a discharging cell that is defined by address, scan and sustain electrodes, and phosphor applied in the discharging cell. A chassis base supports the plasma display panel and provides a grounding function. And driver stage drives the plasma display panel. The plasma display device displays images by generating visible light by exciting the phosphor with UV light generated during gas discharges.

While the plasma display device is driven, a large amount of electromagnetic waves are generated. Therefore, a front filter including an electromagnetic wave shielding layer is attached on the front surface of the plasma display panel. The front filter induces electromagnetic waves generated in the plasma display panel to a chassis base by using a grounding member.

The grounding member tends to vibrate due to the application of vibrations that are generated either inside or outside the plasma display panel, thereby generating unpleasant noise even during the display of visual images by the plasma display device.

SUMMARY OF THE INVENTION

Accordingly, an aspect of the present invention is to provide a plasma display device that can reduce vibration noise caused by the conductive tape through reducing the vibration of the conductive tape caused by an application of vibration to either the outside or to the inside of the plasma display panel by forming a noise prevention hole in the conductive tape attached to the filter and bracket.

According to one aspect of the present invention, a plasma display device may be constructed with a plasma display panel, a filter attached on a front surface of the plasma display panel, and a chassis base that has a front surface mounted on a rear surface of the plasma display panel, and a driving circuit unit mounted on a rear surface of the chassis base to drive driving the plasma display panel. A plurality of brackets, connected to the rear surface of the chassis base, extend to the front surface of the plasma display panel, and a conductive tape is attached to the filter and bracket. The conductive tape is perforated by a plurality of noise prevention holes.

The chassis base and bracket may be made of metal.

The conductive tape may be attached to an edge of the front surface of the filter and the bracket.

The noise prevention holes may be formed on a region of the conductive tape corresponding to a space between an end of the filter and an end of the bracket.

The diameter of the noise prevention hole may be less than or equal to six millimeters.

The conductive tape may be formed in the plural number to attach to the ends of the filter and bracket, where adjacent lengths of conductive tape may overlap each other in the corner regions of the filter.

The noise prevention holes may be formed on a region except for the region formed by the conductive tapes.

The chassis base may further include a bent part that is bent and extended toward the driving circuit unit from the end of the chassis base, and a reinforcing member is provided at upper and lower parts of the rear surface of the chassis base.

The bracket may include a fastening unit combined with the bent part and with the reinforcing member, by a fastening member. A first extension part that is bent extends toward the front surface of the plasma display panel from an end of the fastening member. A second extension part that is bent extends toward the end of the filter from an end of the first extension part.

The space may be formed by spacing the end of the second extension part and the end of the filter from each other.

The conductive tape may be attached to cover the edge of the front surface of the filter and an outer surface of the second extension part.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
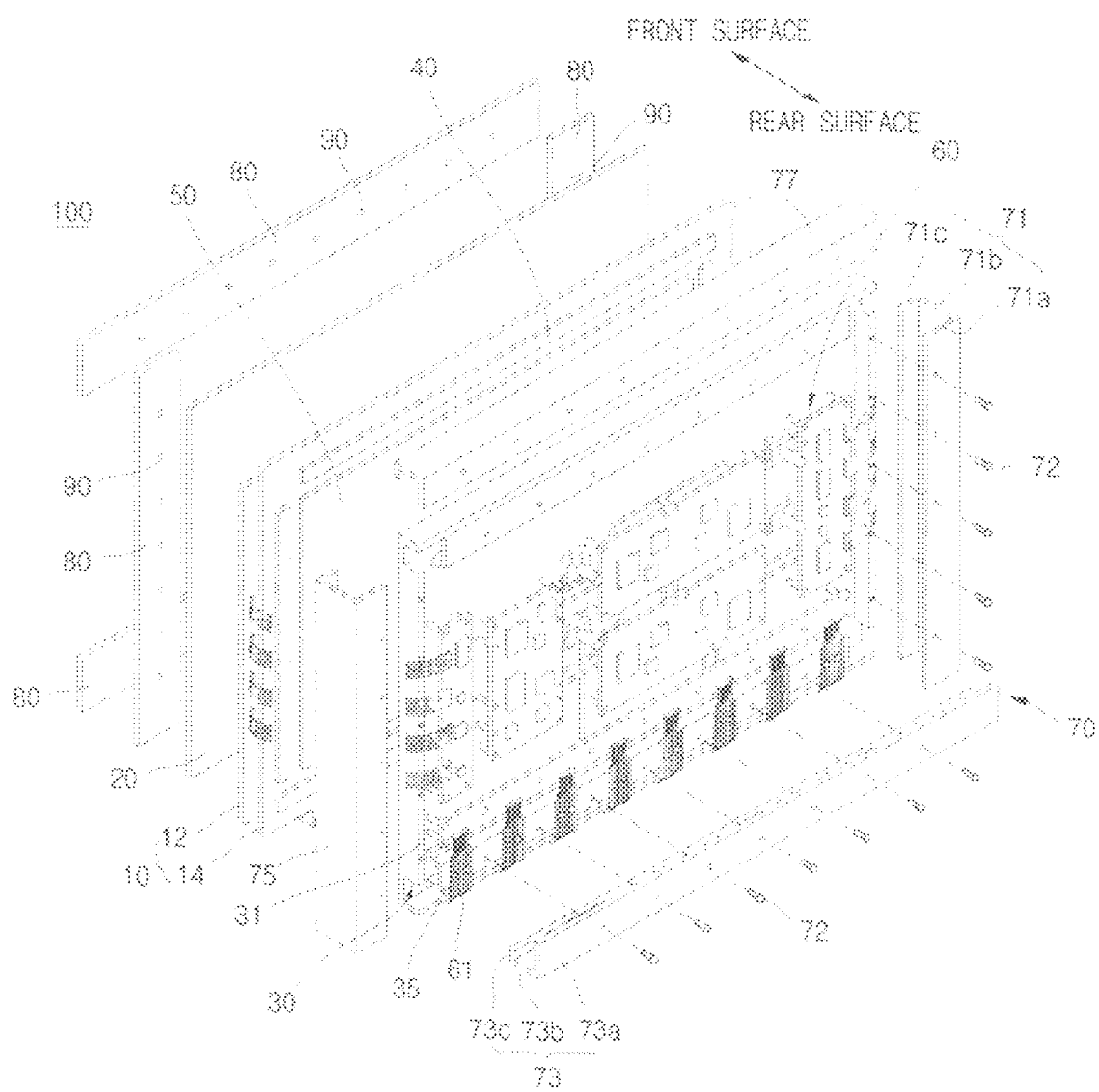
FIG. 1 is an exploded oblique view illustrating a plasma display device according to one embodiment of the present invention.

Hereinafter, embodiments of the present invention will be described in detail with reference to the accompanying drawings. The aspects and features of the present invention and methods for achieving these aspects and features will be apparent by referring to the embodiments to be described in detail with reference to the accompanying drawings. The present invention is not however, limited to the embodiments disclosed hereinafter, but may be implemented in diverse forms. The matters defined in the description, such as the detailed construction and elements, are nothing but specific details provided to assist those of ordinary skill in the art in attaining a comprehensive understanding for the practice of the invention, and the present invention is only defined within the scope of the appended claims. In the entire description of the present invention, the same drawing reference numerals are used for the same elements across various figures.

Figure 2:
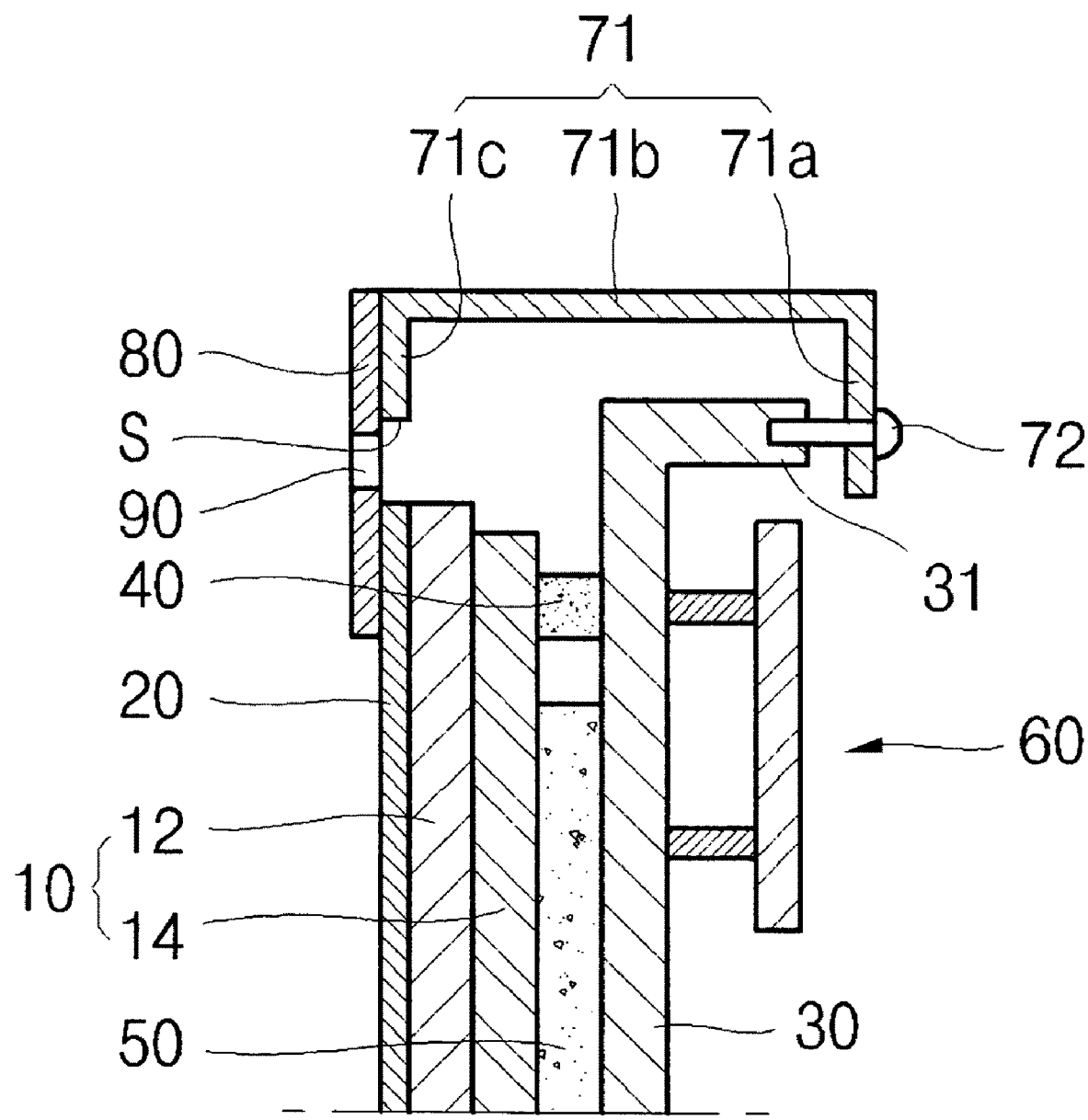
FIG. 2 is a partial cross-sectional view illustrating a combined state of a first bracket in the plasma display device of FIG. 1.
Figure 3:
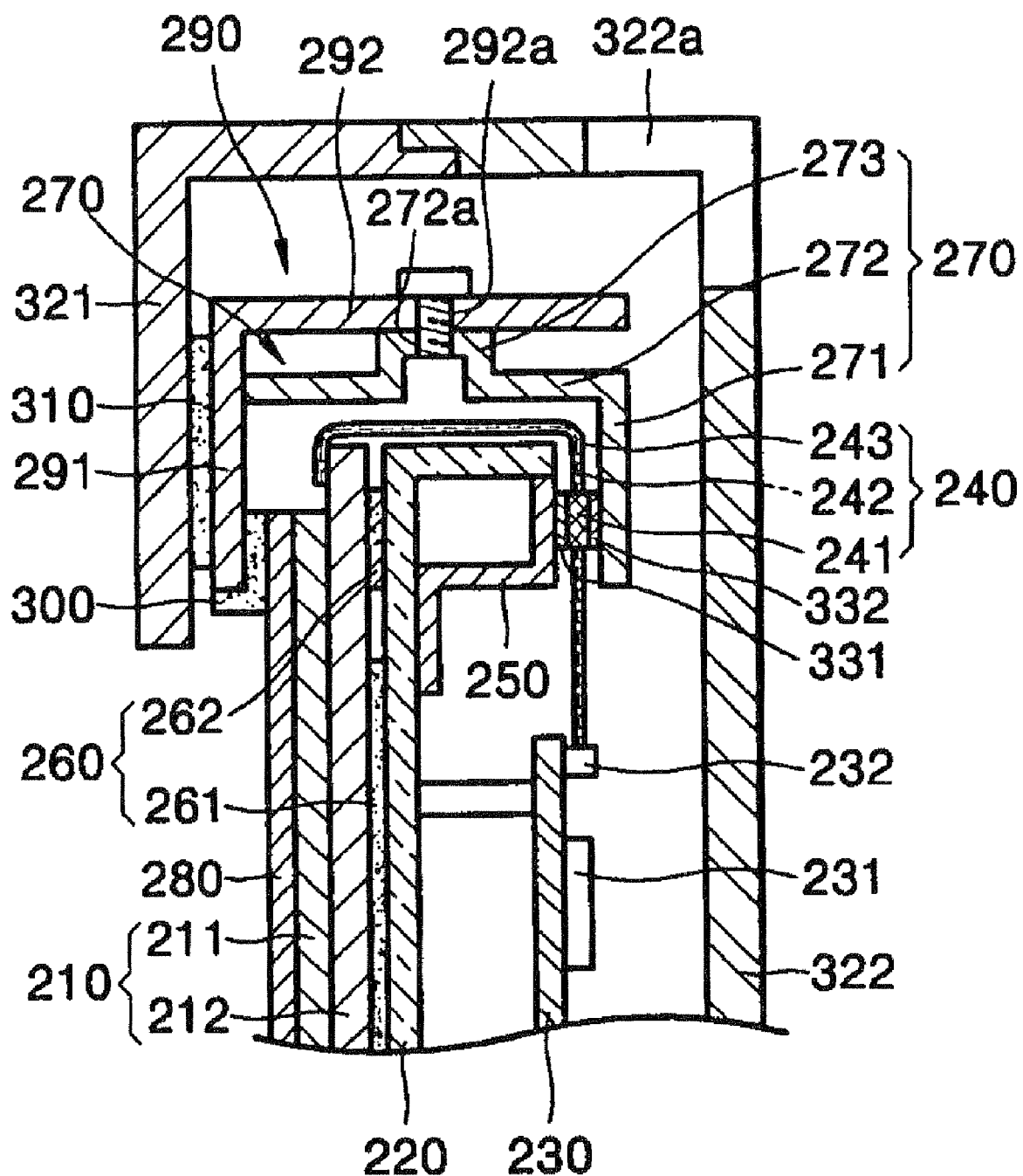
FIG. 3 is a partial cross-sectional view illustrating a combined state of a second bracket in the plasma display device of FIG. 1.
Figure 4:
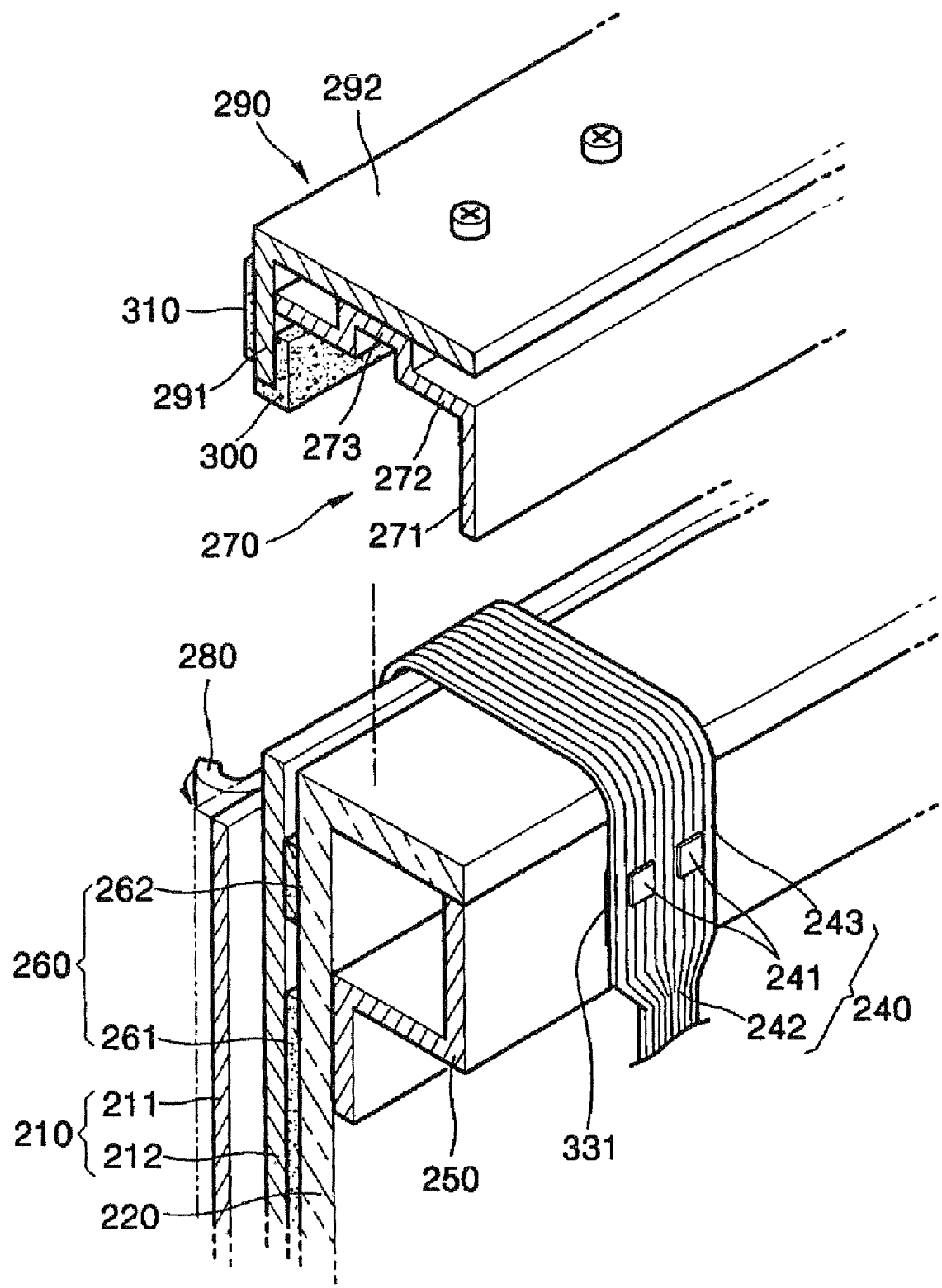
FIG. 4 is a front view illustrating a coupling relationship between a filter, a bracket and a conductive tape in the plasma display device of FIG. 1.
Figure 5:
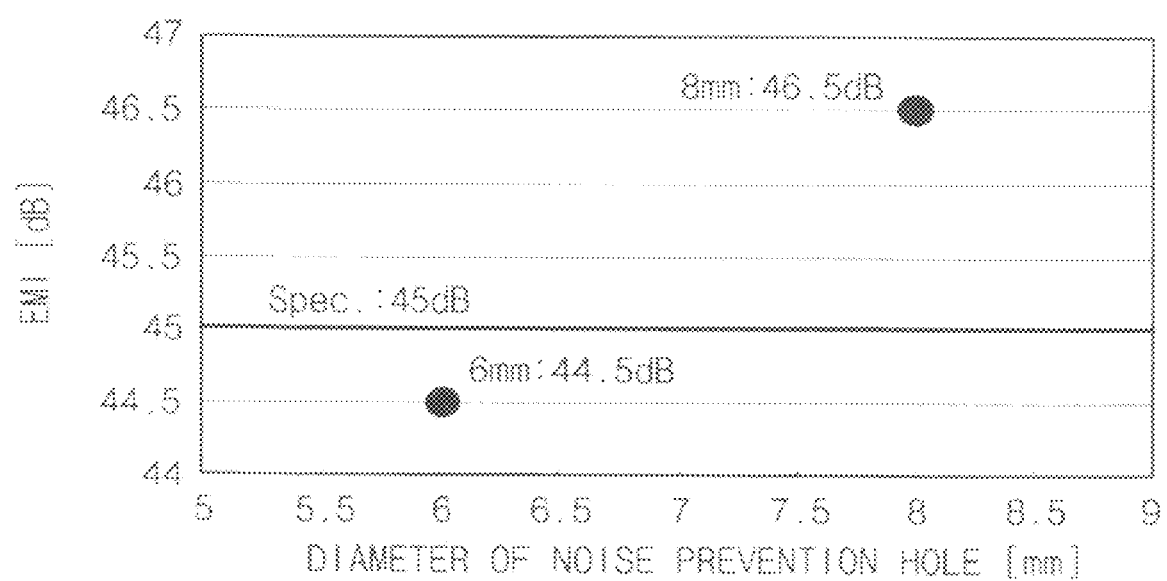
FIG. 5 is a graph illustrating an EMI measurement result obtained from a plasma display device plotted as a function of the size of a noise prevention hole of the conductive tape.

FIG. 1 is an exploded oblique view illustrating a plasma display device constructed as one embodiment of the present invention, FIG. 2 is a partial cross-sectional view illustrating a combined state of a first bracket that may be used in the plasma display device of FIG. 1, FIG. 3 is a partial cross-sectional view illustrating a combined state of a second bracket that may be used in the plasma display device of FIG. 1, FIG. 4 is a front view illustrating a coupling relationship between a filter, a bracket and a conductive tape incorporated into an embodiment of the plasma display device of FIG. 1, and FIG. 5 is a graph illustrating an EMI measurement results obtained from a plasma display device plotted as a function of the size of a noise prevention hole in the conductive tape.

Referring now to FIG. 1, plasma display device 100 constructed as one embodiment according to the principles of the invention, may include a plasma display panel 10, a filter 20, a chassis base 30, a driving circuit unit 60, a plurality of brackets 70, a conductive tape 80 and a noise prevention hole 90.

Plasma display panel 10 is formed by bonding front panel 12 and rear panel 14 to each other in order to display images through gas discharges.

Filter 20 is attached to a front surface of plasma display panel 10, that is, to front panel 12. Filter 20 may include an external light shielding pattern (not shown) to shield external ambient light incident upon plasma display panel 10 from the outside. In addition, filter 20 may include an electromagnetic wave shielding pattern (not shown) to shield electromagnetic waves that are generated inside of plasma display panel 10 and otherwise released to the outside. Filter 20 is not limited to the performance of the above functions and may be amenable to the performance of other functions.

A front surface of chassis base 30 is attached to a rear surface of plasma display panel 10, that is, rear panel 14, by an attaching member 40, thereby supporting plasma display panel 10. Chassis base 30 may be formed of metal and function as a grounding unit. In other words, chassis base 30 may be electrically coupled to the electromagnetic wave shielding pattern (not shown) so as to ground electromagnetic waves transmitted from plasma display panel 10. A heat radiation member 50 may be interposed between chassis base 30 and rear panel 14. Heat radiation member 50 smoothly transmits heat generated in plasma display panel 10 to chassis base 30, thereby releasing the heat to the exterior of plasma display panel 10.

In addition, chassis base 30 may further include a bent part, or flange, 31 that is bent and extended toward the rear of chassis base 30 from an end thereof in order to reinforce the strength of the peripheral edged of bent part 31.

In addition, chassis base 30 may be provided with a reinforcing member 35 on the rear surface thereof. The reinforcing member 35 prevents chassis base 30 from being bent or deformed and thus serves to maintained the rigidity and uniform degree of flatness within the ideal planar surface expected for chassis bas 30. In addition, when reinforcing member 35 is provided to be contacted to a signal transmission unit 61 that is electrically coupling plasma display panel 10 to driving circuit unit 60, reinforcing member 35 also functions as a heat radiation member to release to the ambient environment, heat generated in signal transmission unit 61. Reinforcing member 35 may be simultaneously made together with chassis base 30 from a thermally conducting metal material integrally with chassis base 30. Or, reinforcing member 35 may be made separately from chassis base 30 and attached onto the rear surface of chassis base 30 through a faster with, by way of an example, a faster with, by way of an example, a screw (not shown).

Driving circuit unit 60 is mounted on the rear surface of chassis base 30 and drives plasma display panel 10. For that purpose, driving circuit unit 60 includes a circuit element to drive plasma display panel 10 to display for example, varying visual images.

The plurality of brackets 70 may be combined with the rear surface of chassis base 30, particularly, bent part 31 and reinforcing member 35. The brackets are provided to be extended to the front surface of plasma display panel 10. The plurality of brackets 70 may be formed from the same metal as chassis base 30 and may be disposed with plasma display panel 10 to function as a grounding unit similarly to chassis base 30.

The plurality of brackets 70 such as channel, or C-shapes, may include first to fourth brackets 71, 73, 75 and 77. The first to fourth brackets 71, 73, 75 and 77 may be provided at right, left, upper and lower sides of chassis base 30 respectively, aligned with the opposite edged formed by flanges 31.

Referring to FIG. 2, first bracket 71 may include a fastening unit 71a, first and second extension parts 71b and 71c. In effect, fastening unit 71a and second exterior part 71c serve as flanges that are held spaced-apart and stationary by the intermediate first extension part 71b which serves as a web for the channel, or C-shaped, structural member 71.

Fastening unit 71a is arranged in parallel to plasma display panel 10 and fastened to bent part 31 of chassis base 30 by a fastening member 72. Fastening unit 71a substantially combines chassis base 30 and first bracket 71 with each other. display panel 10, in geometric parallel with bent, part 31 from an end of fastening unit 71a.

The second extension part 71c is bent and extended toward the end of filter 20 in geometric parallel to plasma display panel 10 from an end of the first extension part 71b. A predetermined gap (S) is formed between the end of the second extension part 71c and the end of filter 20. More particularly, space S is formed by spacing the distal edge of the second extension part 71c and the terminal edge of filter 20 from each other.

Referring to FIG. 3, second bracket 73 may include a fastening unit, or flange, 73a, first and second extension parts 73b and 73c that respectively serve as a web 73b and a second flange 73c for the channel, or C-shape, structural member 73.

Fastening unit 73a is arranged in geometric parallel with plasma display panel 10 and is fastened to reinforcing member 35 of chassis base 30 by fastening member 72. Fastening unit 73a substantively combines chassis base 30 and second bracket 73 together with each other.

The first extension part 73b is bent and extended toward the front surface of plasma display panel 10 in geometric parallel to bent part 31, from an end of fastening unit 73a.

The second extension part 73c is bent and extended toward the end of filter 20 in geometric parallel with plasma display panel 10 from an end flange for the first extension part 73b. A predetermined gap (S) is formed between the distal edge of the second extension part 73c and the terminal edge of filter 20.

The second bracket 73 can function as the grounding unit, and also protect signal transmission unit 61 shown in FIG. 1 from external impacts while releasing heat generated from signal transmission unit 61 shown in FIG. 1.

The third and fourth brackets 75 and 77 have the same shapes and functions as the first and second brackets 71 and 73 except for their respective directions of installation. Accordingly, explanation about the third and fourth brackets 75 and 77 need not be further explained. In addition, a fastener, such as screw 72, combines the third and fourth brackets 75 and 77 together with chassis base 30 as is illustrated by in FIG. 1.

Turning now to FIG. 4, conductive tape 80 is attached to the terminal edges of the front surface of filter 20 and the plurality of brackets 70 (for example, the outer surface of the second extension part 71c in a case of the first bracket 71), thereby electrically coupling filter 20 to the plurality of brackets 70. Conductive tape 80 attenuates and releases electromagnetic waves incident upon filter 20, for example, electromagnetic waves generated while plasma display panel 10 is driven y driving current 60, by transmitting the electromagnetic waves to chassis base 30. For that purpose, conductive tape 80 includes electrically conductive material.

Conductive tape 80 may be provided in the plural number, and desirably, in the same number as the plurality of brackets 70. Steps of conductive tape 80 may be easily attached to span from the edges of the front surface of filter 20 to the neighboring flanges of the plurality of brackets 70 without loosening. Referring to FIG. 4, adjacent converging lengths of conductive tape 80 may overlap with each other in distal end regions (R) of the corners of filter 20.

The plurality of noise prevention holes 90 are formed through conductive tape 80 in a linear array. Noise prevention holes 90 prevent conductive tape 80 from being shaken by vibration generated inside of plasma display panel 10 during driving plasma display device 100, or by sudden vibrations generated from the outside of plasma display panel 10. In other words, when conductive tape 80 is shaken by vibrations generated in the interior or the exterior of plasma display panel 10, noise prevention holes 90 interrupts flow of the vibration of conductive tape 80. As a result, vibration of conductive tape 80 is reduced. Accordingly, noise prevention hole 90 can reduce, and attenuate, noise caused by vibration of conductive tape 80. Noise prevention hole 90 may be formed along the lengths of the strips of conductive tape 80 except for the overlap region (R) of the adjacent conductive tape 80. That is, the reason that the overlap region (R) is little affected by vibrations generated from the inside or from the outside of plasma display panel 10 because the region (R) is thicker than other portions of the intermediate lengths of conductive tape 80, even if noise prevention hole 90 is not formed.

Referring to FIG. 4, it is desirable that noise prevention holes 90 be formed in a region of conductive tape 80 corresponding to a space (S) between the end of filter 20 and the ends of the plurality of brackets 70, as is illustrated in FIGS. 3 and 4, because the adhesive force of conductive tape 80 may be weakened when noise prevention hole 90 is formed in the region of conductive tape 80 that is substantially attached to filter 20 or plurality of brackets 70.

Turning now to FIG. 5, in addition, a diameter of noise prevention hole 90 may be within a range extending from approximately 3 to 6 mm, because noise cannot be largely reduced because flow of the vibration of conductive tape 80 is not interrupted enough when the diameter of a noise prevention hole 90 is less than 3 mm, and the grounding function attained by transmitting electromagnetic waves incident upon filter 20 to chassis base 30 is degraded when the diameter of a noise prevention hole 90 is more than 6 mm. The graph of FIG. 5 shows that the grounding function of conductive tape 80 is degraded when the diameter of noise prevention hole 90 is larger than 6 mm.

Referring again to FIG. 5, in a case of the plasma display device using the conductive tape with a noise prevention hole whose diameter is 6 mm, the measured numerical value representative of electromagnetic wave was 44.5 dB, which is lower than 45 dB, that is, a permissible value of electromagnetic wave. On the other hand, in a case of the plasma display device using the conductive tape with a noise prevention hole whose diameter is 8 mm, the measured numerical value of electromagnetic wave was 46.5 dB, which is higher than 45 dB, that is, the permissible value of electromagnetic wave. This result demonstrates that the grounding function of the conductive tape is greatly affected when the diameter of the noise prevention hole is larger than 6 mm.

In cases where NTSC (National Television System Committee) signal and PAL (Phase Alteration Line) signal are respectively applied to a plasma display device using a conductive tape with a noise prevention hole and a plasma display device using a conductive tape without a noise prevention hole, a comparison of test results of measured noise levels will be explained below.

Figure 6:
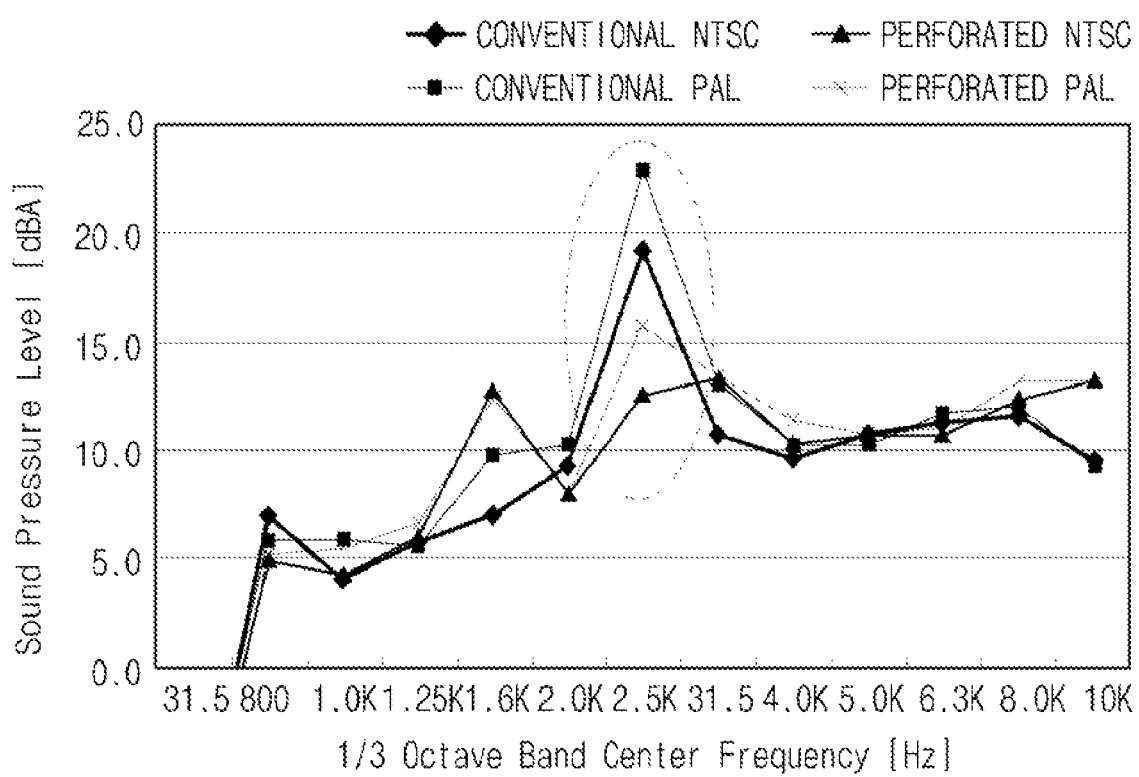
FIG. 6 is a graph illustrating noise measurement results obtained from a plasma display device plotted according to the formation of the noise prevention hole of the conductive tape.

FIG. 6 is a graph illustrating noise measurement results obtained from a plasma display device for different formations of the noise prevention hole of the conductive tape.

In the graph of FIG. 6, the 'conventional NTSC' indicates the case where the NTSC signal is applied to a plasma display device using a conductive tape without any noise prevention hole. The 'perforated NTSC' indicates the case where the NTSC signal is applied to a plasma display device using a conductive tape with a noise prevention hole; the 'conventional PAL' indicates the case where the PAL signal is applied to the plasma display device using a conductive tape without any noise prevention hole; and the 'perforated PAL' indicates the case where the PAL signal is applied to the plasma display device using a conductive tape with a noise prevention hole.

Referring to FIG. 6, in the case of 'conventional NTSC', a sound pressure level of the plasma display device was about 18[dBA] in an octave band center frequency of, for example, 2.5 k[Hz]. In the case of 'perforated NTSC', the sound pressure level of the plasma display device was about 13[dBA] in the octave band center frequency of, for example, 2.5 k[Hz].

In addition, in the case of 'conventional PAL', the sound pressure level of the plasma display device was about 23.5 [dBA] in an octave band center frequency of, for example, 2.5 k [Hz]. In the case of 'perforated PAL', the sound pressure level of the plasma display device was about 16[dBA] in the octave band center frequency of, for example, 2.5 k [Hz].

It is proved from above results that noise reduction effect is provided irrespective of whether the device is a NTSC or PAL type, when the conductive tape with the noise prevention hole is applied to the plasma display device.

As described above, plasma display device 100 constructed as one embodiment of the present invention can reduce vibration noise of conductive tape 80 through a reduction of the vibration of conductive tape 80 caused by vibrations applied from either the outside or inside of plasma display panel 10 by forming noise prevention holes 90 in conductive tape 80. Thus, the total noise of plasma display device 100 is reduced.

In addition, plasma display device 100 can reduce vibration noise of conductive tape 80 largely without affecting the grounding function of conductive tape 80 through forming a noise prevention hole 90 having the diameter within a range of 3 to 6 mm extending through conductive tape 80.

As described above, the plasma display device according to one embodiment of the present invention can reduce vibration noise of the conductive tape by reducing the vibration of the conductive tape caused by vibration of the outside or inside of the plasma display panel by forming the noise prevention hole on, or through, the conductive tape attached to both the filter and bracket and spanning across gap S.

It should be understood by those of ordinary skill in the art that various replacements, modifications and changes in the form and details may be made therein without departing from the spirit and scope of the present invention as defined by the following claims. Therefore, it is to be appreciated that the above described embodiments are for purposes of illustration only and are not to be construed as limitations of the invention.

What is claimed is:

1. A plasma display device, comprising:
   a plasma display panel;
   a filter attached on a front surface of the plasma display panel;
   a chassis base whose front surface is mounted on a rear surface of the plasma display panel;
   a driving circuit unit, mounted on a rear surface of the chassis base, driving the plasma display panel;
   a plurality of brackets, connected to the rear surface of the chassis base, being extended to the front surface of the plasma display panel; and
   a plurality of conductive tapes, attached to the filter and bracket;
   where the plurality of conductive tapes includes a plurality of noise prevention holes and adjacent conductive tapes of the plurality of conductive tapes overlap each other in a corner region of the filter.

2. The plasma display device of claim 1, wherein the chassis base and bracket are made of metal.

3. The plasma display device of claim 1, wherein the plurality of conductive tapes are each attached to an edge of the front surface of the filter and the bracket.

4. The plasma display device of claim 1, wherein the noise prevention holes are formed on a region of the plurality of conductive tapes corresponding to a space between an end of the filter and an end of the bracket.

5. The plasma display device of claim 1, wherein a diameter of the noise prevention hole is less than or equal to 6 mm.

6. The plasma display device of claim 1, wherein the noise prevention holes are formed on a region except for the overlap region of the plurality of conductive tapes.

7. The plasma display device of claim 4, wherein the chassis base comprises a bent part that is bent and extended toward the driving circuit unit from the end of the chassis base and a reinforcing member provided at upper and lower parts of the rear surface of the chassis base.

8. The plasma display device of claim 7, wherein the bracket comprises:
   a fastening unit combined with the bent part and reinforcing member by a fastening member;
   a first extension part that is bent and extended toward the front surface of the plasma display panel from an end of the fastening member; and
   a second extension part that is bent and extended toward the end of the filter from an end of the first extension part.

9. The plasma display device of claim 8, wherein a space is formed by spacing the end of the second extension part and the end of the filter from each other.

10. The plasma display device of claim 9, wherein the plurality of conductive tapes are attached to cover the edge of the front surface of the filter and an outer surface of the second extension part.

11. A plasma display device, comprising:
    a plasma display panel;
    a filter attached on a front surface of the plasma display panel;
    a chassis base whose front surface is mounted on a rear surface of the plasma display panel;
    a driving circuit unit, mounted on a rear surface of the chassis base, driving the plasma display panel;
    a plurality of brackets, connected to the rear surface of the chassis base, being extended to the front surface of the plasma display panel; and
    a plurality of conductive tapes, attached to the filter and bracket;
    where the plurality of conductive tapes include a linear array formed by a plurality of noise prevention holes, and adjacent conductive tapes of the plurality of conductive tapes overlap each other in a corner region of the filter,
    wherein a diameter of the noise prevention hole is less than or equal to 6 mm.

12. The plasma display device of claim 11, wherein the bracket comprises:
    a fastening unit combined with a bent part and reinforcing member by a fastening member;
    a first extension part that is bent and extended toward the front surface of the plasma display panel from an end of the fastening member; and
    a second extension part that is bent and extended toward an end of the filter from an end of the first extension part.

13. The plasma display device of claim 12, wherein a space is formed by spacing an end of the second extension part and the end of the filter from each other.

14. The plasma display device of claim 13, wherein the plurality of conductive tapes are attached to cover the edge of the front surface of the filter and an outer surface of the second extension part.

15. The plasma display device of claim 11, wherein chassis base comprises:
    a reinforcing member fastened to a fastening unit of the bracket.

* * * * *